(12) United States Patent
Ma et al.

(10) Patent No.: US 11,139,917 B2
(45) Date of Patent: Oct. 5, 2021

(54) COMMUNICATION METHOD AND APPARATUS USING SEGMENTED BIT SEQUENCES

(71) Applicant: Hauwei Technologies Co., Ltd., Shenzhen (CN)

(72) Inventors: Liang Ma, Shanghai (CN); Xin Zeng, Shenzhen (CN); Carmela Cozzo, San Diego, CA (US); Yuejun Wei, Shanghai (CN)

(73) Assignee: Hauwei Technologies Co., Ltd., Shenzhen (CN)

( * ) Notice: Subject to any disclaimer, the term of this patent is extended or adjusted under 35 U.S.C. 154(b) by 64 days.

(21) Appl. No.: 16/580,961

(22) Filed: Sep. 24, 2019

(65) Prior Publication Data

US 2020/0021396 A1 Jan. 16, 2020

Related U.S. Application Data

(63) Continuation of application No. PCT/CN2018/080380, filed on Mar. 24, 2018.

(30) Foreign Application Priority Data

Mar. 24, 2017 (CN) .......................... 201710184937.2
May 3, 2017 (CN) .......................... 201710305802.7

(51) Int. Cl.
*H03M 13/00* (2006.01)
*H04L 1/00* (2006.01)
*H03M 13/15* (2006.01)

(52) U.S. Cl.
CPC ........ *H04L 1/0058* (2013.01); *H03M 13/155* (2013.01)

(58) Field of Classification Search
CPC ........................... H04L 1/005; H03M 13/155
See application file for complete search history.

(56) References Cited

U.S. PATENT DOCUMENTS

| 2008/0204286 | A1 | 8/2008 | Kose |
| 2015/0280747 | A1 | 10/2015 | Park et al. |
| 2020/0235752 | A1* | 7/2020 | Sandberg ........... H03M 13/6522 |

FOREIGN PATENT DOCUMENTS

| CN | 101431396 A | 5/2009 |
| CN | 101667884 A | 3/2010 |

(Continued)

OTHER PUBLICATIONS

"Code Block Segmentation for LDPC Codes," 3GPP TSG-RAN WG1 #88, Athens, Greece, R1-1701629, pp. 1-5, 3rd Generation Partnership Project, Valbonne, France (Feb. 13-17, 2017).

(Continued)

*Primary Examiner* — Samir W Rizk
(74) *Attorney, Agent, or Firm* — Leydig, Voit & Mayer, Ltd.

(57) ABSTRACT

A communication method is provided, including: obtaining a to-be-segmented first bit sequence, where a quantity of bits in the first bit sequence is B, and a quantity of bits that can be carried by a physical resource corresponding to the first bit sequence is $N_1$; determining, based on $N_1$ and a parameter L, a quantity C of bit sequences obtained by segmenting the first bit sequence, where a value of L is equal to $(B+B_1)/R_{min,K_{max}}$, $R_{min,K_{max}}$ is a minimum bit rate corresponding to an available maximum code block length $K_{max}$, and $B_1$ is an integer greater than or equal to 0; and segmenting the first bit sequence into C segmented bit sequences. Based on the method, a proper code block segmentation scheme can be provided.

20 Claims, 4 Drawing Sheets

(56) References Cited

FOREIGN PATENT DOCUMENTS

CN          104660370 A     5/2015
CN          105281868 A     1/2016
WO      2012155683 A1   11/2012

OTHER PUBLICATIONS

Wang et al., "Capacity Bounds and Concatenated Codes over Segmented Deletion Channels," IEEE Transactions on Communications, vol. 61, No. 3, pp. 852-864, Institute of Electrical and Electronics Engineers, New York, New York (Mar. 2013).

Gallager, "Low-Density Parity-Check Codes," IRE Transactions on Information Theory, vol. 8, Issue 1, pp. 21-28 (Jan. 1962).

"3rd Generation Partnership Project; Technical Specification Group Radio Access Network; Evolved Universal Terrestrial Radio Access (E-UTRA); Multiplexing and channel coding (Release 13)," 3GPP TS 36.212, V13.4.0, pp. 1-140, 3rd Generation Partnership Project, Valbonne, France (Dec. 2012).

\* cited by examiner

COMMUNICATION METHOD AND APPARATUS USING SEGMENTED BIT SEQUENCES

CROSS-REFERENCE TO RELATED APPLICATIONS

This application is a continuation of International Application No. PCT/CN2018/080380, filed on Mar. 24, 2018, which claims priority to Chinese Patent Application No. 201710184937.2, filed on Mar. 24, 2017 and Chinese Patent Application No. 201710305802.7, filed on May 3, 2017. All of the aforementioned patent applications are hereby incorporated by reference in their entireties.

TECHNICAL FIELD

Embodiments of this application relate to communications technologies, and in particular, to a communication method and a communications apparatus.

BACKGROUND

In a long term evolution (LTE) protocol, a turbo code encoder supports a maximum block length of 6144 bits. To support a longer information length, a code block segmentation operation is performed before encoding. To be specific, a sequence including more than 6144 bits is segmented into a plurality of code blocks for encoding.

With development of technologies, a low-density parity-check (LDPC) bit is introduced into a communications system to encode information, and a check matrix of the low-density parity-check bit is a sparse matrix.

In an LDPC encoding system, when a total quantity of bits is relatively small after encoding, a decoding block error rate decreases rapidly with an increase of the total quantity of bits after encoding. When the total quantity of bits is relatively large after encoding, the decoding block error rate decreases slowly. A positive correlation exists between complexity of an LDPC decoder and the quantity of bits after encoding. Therefore, from a perspective of balancing the decoding error block rate and the complexity of the decoder, a quantity of bits in an encoded bit sequence can be limited, so that the LDPC decoder has proper decoding complexity in consideration of a specific decoding error block rate. In other words, in an LDPC encoding communications system, the quantity of bits in the encoded bit sequence is limited.

However, currently, no proper bit sequence segmentation scheme can be applied to a communications system in which a quantity of bits in an encoded bit sequence is limited.

SUMMARY

Embodiments of this application provide a communication method and a communications apparatus, to provide a communication method for a communications system in which a quantity of bits in an encoded bit sequence is limited, thereby properly performing bit sequence segmentation.

According to an aspect, an embodiment of this application provides a communication method. The method includes: obtaining a to-be-segmented first bit sequence, where a quantity of bits in the first bit sequence is B, and a quantity of bits that can be carried by a physical resource corresponding to the first bit sequence is $N_1$; determining, based on $N_1$ and a parameter L, a quantity C of bit sequences obtained by segmenting the first bit sequence, where a value of L is equal to $(B+B_1)/R_{min,K_{max}}$, $R_{min,K_{max}}$ is a minimum bit rate corresponding to an available maximum code block length $K_{max}$, and $B_1$ is an integer greater than or equal to 0; and segmenting the first bit sequence into C segmented bit sequences. In the foregoing method, a quantity of segmented code blocks is determined with reference to $N_1$ and L, and a proper code block segmentation scheme is provided, so that an encoding gain loss can be avoided as much as possible.

According to another aspect, an embodiment of this application provides a communications apparatus. The communications apparatus may be configured to implement the foregoing communication method. The communications apparatus may be a terminal, a base station, a baseband chip, a data signal processing chip, or a general-purpose chip.

In an optional design, the communications apparatus includes a memory and a processor. The memory is configured to store a to-be-segmented first bit sequence. The processor is configured to: determine, based on $N_1$ and a parameter L, a quantity C of bit sequences obtained by segmenting the first bit sequence, where a value of L is equal to $(B+B_1)/R_{min,K_{max}}$, $R_{min,K_{max}}$ is a minimum bit rate corresponding to an available maximum code block length $K_{max}$, and $B_1$ is an integer greater than or equal to 0; and segment the first bit sequence into C segmented bit sequences.

Determining a quantity of segmented code blocks based on $N_1$ and L may be determining C by comparing $N_1$ with L (or by comparing L with $N_1$), or may be determining C by comparing $N_1$ with $(B+B_1)/R_{min,K_{max}}$ (or by comparing $(B+B_1)/R_{min,K_{max}}$ with $N_1$).

Herein, $B_1$ is an adjustment value (or a correction value). It may be understood that, C may be determined without using the adjustment value $B_1$. In other words, $B_1$ is equal to 0. When $B_1$ is equal to 0, and the value of L is equal to $B/R_{min,K_{max}}$, determining the quantity of segmented code blocks based on $N_1$ and L may be determining C by comparing $N_1$ with L (or by comparing L with $N_1$), or may be determining C by comparing $N_1$ with $B/R_{min,K_{max}}$ (or by comparing $B/R_{min,K_{max}}$ with $N_1$).

A possible manner of determining C may be: when $L<N_1$, determining that $C=\lceil N_1/N_{max} \rceil$, where $\lceil\ \rceil$ represents rounding up, and a value of $N_{max}$ is equal to a value of $K_{max}/R_{min,K_{max}}$. Herein, C determined in the foregoing manner enables that a code block length of a segmented code block obtained after encoding and rate matching is as close to $N_{max}$ as possible, and a code length gain can be obtained as much as possible without losing a bit rate gain, thereby improving decoding performance.

Another possible manner of determining C may be: when $L<N_1$, determining that $C_{tmp}=\lceil N_1/N_{max} \rceil$, where $\lceil\ \rceil$ represents rounding up, and a value of $N_{max}$ is equal to a value of $K_{max}/R_{min,K_{max}}$; and when $\lceil N_1/C_{tmp} \rceil < N_{threshold}$, $C=C_{tmp}-\Delta$; where $N_{threshold}$ is a preset threshold, $\Delta$ is an offset, $\Delta$ is a positive integer, and a value of $\Delta$ meets that $\lceil (B+B_1)/(C_{tmp}-\Delta) \rceil \leq K_{max}$. Herein, when a length of an encoded block of a segmented bit sequence is less than $N_{threshold}$, it indicates that a code block segmentation operation causes a relatively large gain loss of a length of an encoded block. After $C_{tmp}$ is corrected by using the offset $\Delta$, the gain loss of the length of the encoded block can be reduced, and transport block decoding performance can be improved.

Another possible manner of determining C may be: when $L<N_1$, determining that $C=\lceil N_1'/N_{max} \rceil$, where $\lceil\ \rceil$ represents rounding up, a value of $N_{max}$ is equal to a value of $K_{max}/R_{min,K_{max}}$, $N_1'=\min(N_1, (B+B_1)/R_{min})$, and $R_{min}$ is a minimum bit rate used for encoding. Therefore, decoding performance can be improved.

Another possible manner of determining C may be: when $L<N_1$, determining that $C_{tmp}=\lceil N_1'/N_{max}\rceil$, where $\lceil\ \rceil$ represents rounding up, a value of $N_{max}$ is equal to a value of $K_{max}/R_{min,K_{max}}$, $N_1'=\min(N_1, (B+B_1)/R_{min})$, and $R_{min}$ is a minimum bit rate used for encoding; and when $\lceil N_1'/C_{tmp}\rceil<N_{threshold}$, determining that $C_{tmp}-\Delta$, where $N_{threshold}$ is a preset threshold, $\Delta$ is an offset, $\Delta$ is a positive integer, and a value of $\Delta$ meets that $\lceil(B+B_1)/(C_{tmp}-\Delta)\rceil\leq K_{max}$. Therefore, decoding performance can be improved.

Another possible manner of determining C may be: when $L\geq N_1$, determining that $C=\lceil(B+B_1)/(K_{max}-L_{CB})\rceil$, where $\lceil\ \rceil$ represents rounding up, and is a quantity of check bits included in a segmented bit sequence. Herein, when a length of the segmented bit sequence is less than $K_{max}$, a length of each segmented bit sequence may be as long as possible, thereby obtaining a relatively ideal code length gain and improving decoding performance.

Optionally, the foregoing B may be determined in the following manner: determining that $B=K_{TB}+L_{TB}$, where $K_{TB}$ is a transport block length, $L_{TB}$ is a quantity of check bits in a transport block, $L_{TB}$ is an integer greater than or equal to 0; and when $L_{TB}=0$, determining that $B=K_{TB}$.

The foregoing $B_1$ is an adjustment value (or a correction value), and a value of $B_1$ may be defined based on a system design. For example, when $B_1$ is greater than 0, the value of $B_1$ is equal to a sum of quantities of code block group check bits in A code block groups, the code block groups are groups of the C segmented bit sequences, and A is a quantity of code block groups. In this design, when the quantity C of segmented bit sequences is being determined, a quantity of code block group check bits is considered in advance. In this way, the following problem can be avoided: A difference between lengths of the segmented bit sequences is relatively large and bit rates of different encoded code blocks are not uniform. Therefore, decoding performance is improved.

Optionally, a code block group check bit may be added after a last code block in each of the A code block groups.

Alternatively, it may be designed that the value of foregoing $B_1$ is related to one or more other system parameters. This is not limited.

According to the design scheme provided in this application, the adjustment value $B_1$ may not be required. In other words, $B_1$ is equal to 0.

Optionally, the method and the apparatus provided in this application may be applied to a communications system using an LDPC.

In another optional design, the foregoing communications apparatus includes a processor and a memory. The memory is configured to store an instruction for implementing the foregoing communication method. The processor is configured to execute the foregoing instruction to implement the foregoing communication method.

Optionally, the foregoing communications apparatus may further include a transceiver.

An embodiment of this application further provides a computer program product. The program product includes an instruction used to implement the foregoing method.

An embodiment of this application further provides a computer readable storage medium. The medium stores an instruction used to implement the foregoing communication method.

DESCRIPTION OF DRAWINGS

To describe the technical solutions in the embodiments of this application more clearly, the following briefly describes the accompanying drawings required for describing the embodiments.

DESCRIPTION OF EMBODIMENTS

The following describes the embodiments of this application with reference to the accompanying drawings in this application.

The following describes some terms and agreements in this application.

A bit sequence is a sequence consisting of a bit "0" and/or a bit "1". A bit sequence length means a quantity of bits included in the bit sequence. For example, a bit sequence "00" includes two bits, and a bit sequence length is 2; a bit sequence "111" includes three bits, and a bit sequence length is 3; and a bit sequence "0100" includes four bits, and a bit sequence length is 4.

Both a transport block (TB) and a code block (CB) can be considered as bit sequences. The code block is obtained by segmenting the transport block or a processed transport block and is an object of encoding. Therefore, in this application, a code block length means a quantity of bits included in a bit sequence corresponding to the code block, and a transport block length means a quantity of bits included in a bit sequence corresponding to the transport block. The transport block length may also be referred to as a transport block size. It is understood that different terminologies may be used to describe the transport block or the code block with development of technologies.

A natural number mentioned in the embodiments of this application includes 0.

In the embodiments of this application, a communications apparatus is an apparatus that has a communication function. For example, the communications apparatus may be a base station, a terminal, or a chip. The chip may be, for example, a baseband chip or a communications chip.

Figure 1:
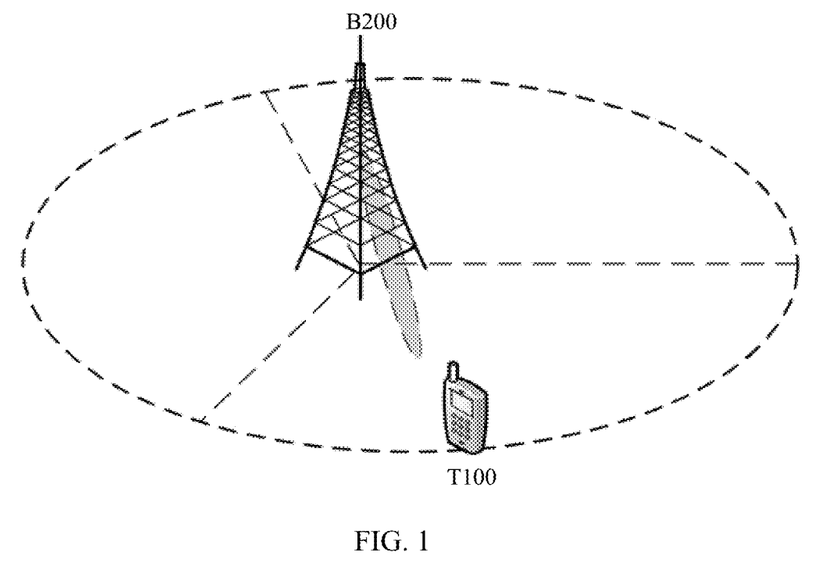
FIG. 1 is a simplified schematic diagram of a wireless communications system.

A technical solution in the embodiments of this application may be applied to a wireless communications system shown in FIG. 1. As shown in FIG. 1, the wireless communications system includes at least one base station B200 and a terminal T100 (only one is shown in the figure). The base station B200 may communicate with the terminal T100 by using different communication resources. For example, the base station B200 may communicate with the terminal T100 by using a wide beam and/or a narrow beam. The wireless communications system may be a 4G communications system such as an LTE (long term evolution) system, or a 5G communications system such as an NR (new radio) system, or a communications system integrating a plurality of communications technologies (for example, a communications system integrating an LTE technology and an NR technology). Each of the base station B200 and the terminal T100 can be used as a sending device or a receiving device. In an uplink, the terminal serves as the sending device, and the base station serves as the receiving device. In a downlink, the base station serves as the sending device, and the terminal serves as the receiving device. It may be understood that the wireless communications system may include a wireless access network and a core network, and the wireless access network includes the base station B200 or may include another access device such as a relay station or another device. The core network may include a core network device, such as a mobility management entity, or another control or storage device.

Figure 2:
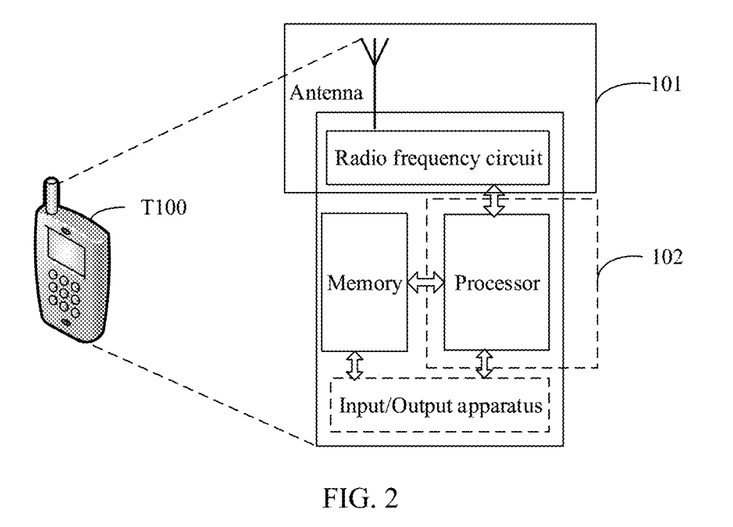
FIG. 2 is a simplified schematic structural diagram of a terminal.

In this application, the terminal T100 is a device that has a wireless communication function, and may be a handheld device that has a wireless communication function, an in-vehicle device, a wearable device, a computing device, another processing device connected to a wireless modem, or the like. The terminal may have different names in different networks, for example, user equipment, a mobile station, a subscriber unit, a station, a cellular phone, a personal digital assistant, a wireless modem, a wireless communications device, a handheld device, a laptop computer, a cordless phone, and a wireless local loop station. It should be noted that, for ease of understanding and illustration, the terminal T100 is shown as a mobile phone in FIG. 1 and FIG. 2. For ease of description, FIG. 2 is a schematic structural diagram of the terminal T100. As shown in FIG. 2, the terminal T100 includes a processor, a memory, a radio frequency circuit, an antenna, and an input/output apparatus. The processor is mainly configured to: process a communication protocol and communication data, control the terminal, execute a software program, and process data of the software program. The memory is mainly configured to store the software program and the data. The radio frequency circuit is mainly configured to: perform a conversion between a baseband signal and a radio frequency signal, and process a radio frequency signal. The antenna is mainly configured to receive and transmit a radio frequency signal in an electromagnetic wave form. The input/output apparatus such as a touchscreen, a display screen, or a keyboard is mainly configured to: receive data entered by a user, and output data to the user. It should be noted that some terminals may not include the input/output apparatus.

When data needs to be sent, after performing baseband processing on the to-be-sent data, the processor outputs a baseband signal to a radio frequency circuit. After performing radio frequency processing on the baseband signal, the radio frequency circuit sends a radio frequency signal in an electromagnetic wave form by using an antenna. When data is sent to the terminal, the radio frequency circuit receives the radio frequency signal by using the antenna, converts the radio frequency signal into the baseband signal, and outputs the baseband signal to the processor. The processor converts the baseband signal into data, and processes the data.

For ease of description, FIG. 2 shows only one memory and only one processor. An actual terminal product may include one or more processors and one or more memories. The memory may also be referred to as a storage medium or a storage device. The memory may be independent of the processor, or may be integrated with the processor. This is not limited in the embodiments of this application.

In an optional implementation, the processor may include a baseband processor and/or a central processing unit. The baseband processor is mainly configured to process the communications protocol and the communication data. The central processing unit is mainly configured to: control the entire terminal, execute the software program, and process the data of the software program. The processor in FIG. 2 integrates functions of the baseband processor and the central processing unit. A person skilled in the art may understand that the baseband processor and the central processing unit may alternatively be separate processors. Optionally, the terminal may include a plurality of baseband processors to adapt to different network standards. Optionally, the terminal may include a plurality of central processing units to enhance a processing capability of the terminal. Optionally, the functions of the baseband processor and the central processing unit may be integrated on a processor. Optionally, various components of the terminal may be connected by using various buses. The baseband processor may also be expressed as a baseband processing circuit or a baseband processing chip. The central processing unit may also be expressed as a central processing circuit or a central processing chip. Optionally, a function of processing the communications protocol and the communication data may be disposed in the processor, or may be stored in a storage unit in a form of a software program. The processor executes the software program to implement a baseband processing function.

In the embodiments of this application, an antenna that has receiving and sending functions and the radio frequency circuit may be considered as a transceiver unit of the terminal, and a processor that has a processing function may be considered as a processing unit of the terminal. As shown in FIG. 2, the terminal T100 includes a transceiver unit 101 and a processing unit 102. The transceiver unit may also be referred to as a transceiver, a transceiver apparatus, or the like. The processing unit may also be referred to as a processor, a processing board, a processing module, a processing apparatus, or the like. Optionally, a component that is in the transceiver unit 101 and that is configured to implement a receiving function may be considered as a receiving unit, and a component that is in the transceiver unit 101 and that is configured to implement a sending function may be considered as a sending unit. In other words, the transceiver unit 101 includes the receiving unit and the sending unit. Sometimes, the transceiver unit may also be referred to as a transceiver, a transceiver circuit, or the like. Sometimes, the receiving unit may also be referred to as a receiver, a receiver circuit, or the like. Sometimes, the sending unit may also be referred to as a transmitter, a transmitter circuit, or the like.

The base station B200 may also be referred to as a base station device, and is a device that is deployed in a radio access network to provide a wireless communication function. For example, a base station in an LTE network is referred to as an evolved NodeB (eNB or eNodeB), and a base station in an NR network is referred to as a TRP (transmission reception point) or a gNB (next generation NodeB). A structure of the base station B200 may be shown in FIG. 3. The base station B200 shown in FIG. 3 may be a separated base station. For example, a distributed base station including antennas, a remote radio unit (RRU), and a baseband unit (BBU) is shown on a left side of FIG. 3. Alternatively, the base station shown in FIG. 3 may be an integrated base station, such as a small cell shown on a right side of FIG. 3. Generally, the base station includes a part 201 and a part 202. The part 201 is mainly configured to: receive and transmit a radio frequency signal, and perform a conversion between a radio frequency signal and a baseband signal. The part 202 is mainly configured to: perform baseband processing, control the base station, and the like. The part 201 may be usually referred to as a transceiver unit, a transceiver, a transceiver circuit, or the like. The part 202 may be usually referred to as a processing unit. The part 202 is usually a control center of the base station.

Figure 3:
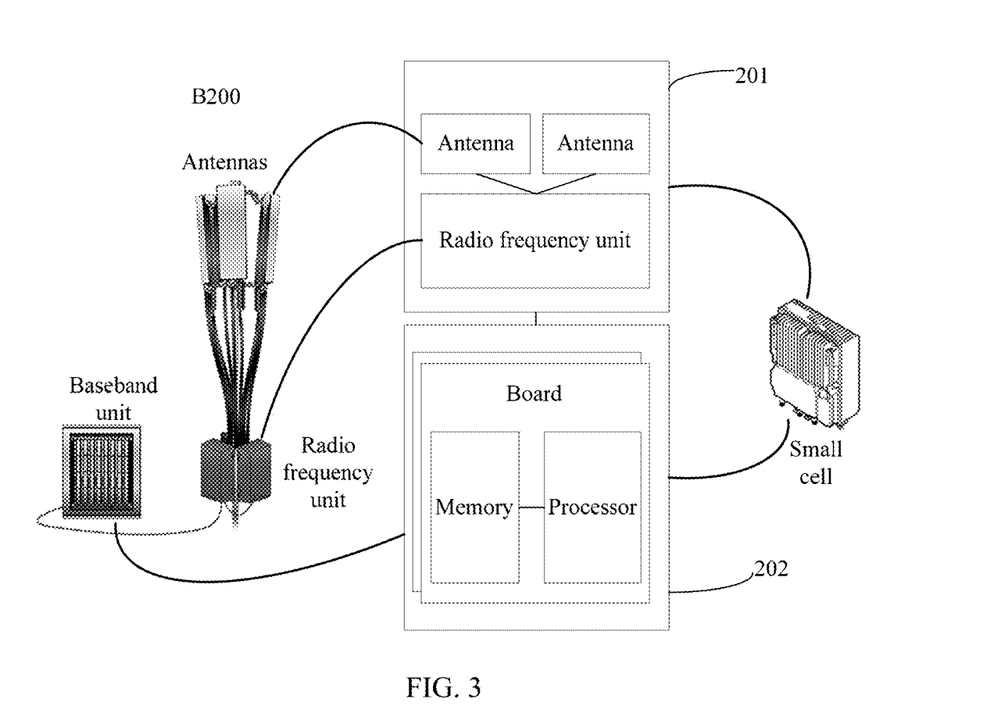
FIG. 3 is a simplified schematic structural diagram of a base station.

In an optional implementation, the part 201 is a transceiver unit that may also be referred to as a transceiver, or the like, and includes antennas and a radio frequency unit. The radio frequency unit is mainly configured to perform radio frequency processing. Optionally, in the part 201, a component configured to implement a receiving function may be considered as a receiving unit, and a component configured to implement a sending function may be considered as a sending unit. In other words, the part 201 includes the receiving unit and the sending unit. For example, the receiving unit may also be referred to as a receiver, a receiver circuit, or the like, and the sending unit may be referred to as a transmitter, a transmitter circuit, or the like.

In an optional implementation, the part 202 may include one or more boards. Each board may include a processor and a memory. The processor is configured to read and execute a program in the memory, to implement a baseband processing function and control on the base station. If the part 202 includes a plurality of boards, the boards may be interconnected to enhance a processing capability.

It may be understood that FIG. 1 to FIG. 3 shows only examples. This application is not limited thereto.

Figure 4:
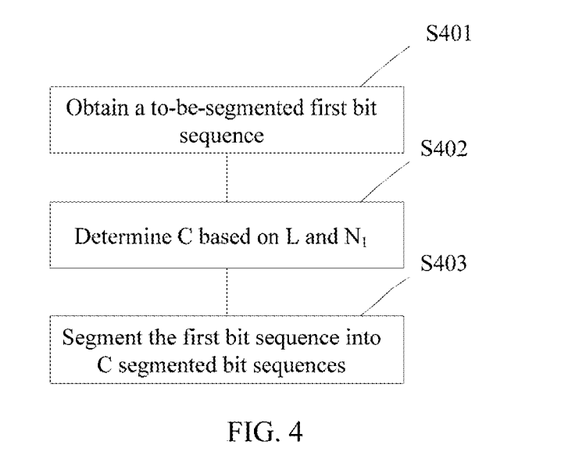
FIG. 4 is a schematic flowchart of a communication method according to an embodiment of this application.

An embodiment of this application provides a communication method. The communication method is implemented by a communications apparatus. The communications apparatus may be a base station, a terminal, a chip, or the like. This is not limited in this embodiment of this application. As shown in FIG. 4, the method may include the following steps.

S401. Obtain a to-be-segmented first bit sequence, where a quantity of bits in the first bit sequence is B, and a quantity of bits carried by a physical resource corresponding to the first bit sequence is $N_1$.

The first bit sequence, namely, a to-be-segmented bit sequence is an input of a code block segmentation operation. In other words, an object of code block segmentation is the first bit sequence.

The first bit sequence may be, for example, a to-be-sent bit sequence, or may be a processed to-be-sent bit sequence.

Processing of the to-be-sent bit sequence may include but is not limited to adding a check bit, for example, adding a cyclic redundancy check (CRC) bit. It should be noted that the check bit herein is the CRC bit in an example. With development of technologies, another check bit may be used to replace the foregoing CRC bit.

Optionally, sometimes, the to-be-sent bit sequence may be referred to as a transport block (TB).

The to-be-sent bit sequence may be transmitted from a higher layer to a physical layer. The higher layer herein may be, for example, a medium access control (MAC) layer.

Reading the input of the code block segmentation operation when the code block segmentation is being performed can be understood as obtaining the first bit sequence. After the first bit sequence is obtained, the quantity of bits in the first bit sequence can be known. In this embodiment of this application, the quantity of bits in the first bit sequence is represented by B.

Optionally, when resource allocation is being performed, terminals to which physical resources used for data transmission are allocated on a scheduling time unit may be determined based on information such as channel state information of a radio link between a base station and a terminal, a user priority, a service priority, or an amount of data in a cache. When a physical resource used for the data transmission is determined, a modulation and coding scheme MCS and a transport block size (TBS) of the data transmission are determined. The transport block size is associated with the quantity B of bits in the first bit sequence. The physical resource may be considered as a physical resource corresponding to the transport block, and the quantity of bits that can be carried by the physical resource is $N_1$. It may be understood that the transport block is associated with the first bit sequence in this embodiment of this application. For example, the foregoing described first bit sequence may be the transport block itself, or may be a processed transport block. Therefore, the physical resource corresponding to the transport block may also be understood as the physical resource corresponding to the first bit sequence. The foregoing is an example manner of understanding the physical resource corresponding to the first bit sequence, and there may be another understanding manner. This is not limited in this embodiment of this application.

It should be noted that the resource allocation described above includes uplink scheduling or downlink scheduling.

S402. Determine, based on the quantity $N_1$ of bits carried by the physical resource corresponding to the first bit sequence and a parameter L, a quantity of bit sequences to be divided from the first bit sequence; in other words, determine a quantity C of bit sequences obtained by segmenting the first bit sequence, where a value of L is equal to $(B+B_1)/R_{min,K_{max}}$, and $R_{min,K_{max}}$ is a minimum bit rate corresponding to an allowed maximum code block length $K_{max}$.

$R_{min,K_{max}}$ is the minimum bit rate corresponding to the available maximum code block length $K_{max}$ in an encoder, where a specific value of $R_{min,K_{max}}$ may be pre-specified in a protocol. The foregoing $B_1$ may be understood as an adjustment value for B, and may have different values in different scenarios.

S403. Segment the first bit sequence into C segmented bit sequences.

After the quantity of segmented bit sequences is determined, the C bit sequences are obtained by segmenting the first bit sequence. The first bit sequence may be segmented in a plurality of manners. For example, the first bit sequence may be approximately evenly segmented into C bit sequences. The segmentation manners are not limited in this embodiment of this application.

Optionally, segmentation may be performed in a manner similar to a manner described in section 5.1.2 of 3GPP TS 36.212 V13.4.0, or may be performed in a improved based on the manner described in the section 5.1.2 of 3GPP TS 36.212 V13.4.0[WRT1].

In addition, the segmentation operation may further include an operation such as filling and/or adding the check bit. In this case, a total length of the C segmented bit sequences is greater than a length of the first bit sequence.

It should be noted that, in this embodiment of this application, for ease of description, a term "bit sequence length" is used, and the bit sequence length means a quantity of bits included in a bit sequence.

In a scenario in which a length of a block encoded by the encoder is limited, when a conventional segmentation method is used, a quantity of bits allocated from the physical resource to a single segmented bit sequence may be greater than a maximum length $N_{max}$ of the encoded block. In this case, an encoded bit segment is repeatedly sent by using a higher bit rate to be filled in all bits after encoding, thereby losing an encoding gain and resulting in an increase in a block error rate of the entire transport block. In this embodiment of this application, a quantity of segmented code blocks is determined with reference to $N_1$ and L, and a proper code block segmentation scheme is provided, so that an encoding gain loss can be avoided as much as possible.

The following describes in detail possible manners of determining the parameters in the foregoing method.

1. For the Parameter $N_1$

Figure 5:
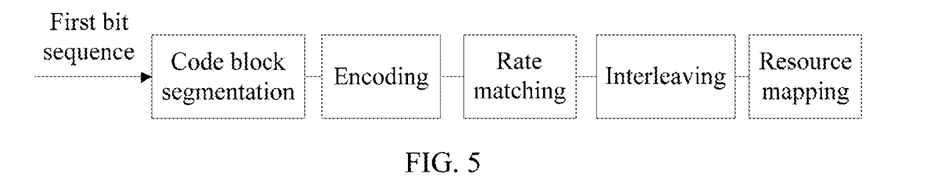
FIG. 5 shows an example process of processing a bit sequence.

Optionally, before sending the first bit sequence to a receiving device, a sending device performs processing such as segmentation, encoding, rate matching, interleaving, and resource mapping on the first bit sequence, for example, processing shown in FIG. 5. It may be understood that FIG. 5 shows only an example of possible processes of processing the first bit sequence. This is not limited in this embodiment of this application.

After being processed, the first bit sequence is mapped onto a resource element (RE). In a communications system, resource allocation may be performed on a resource block (RB) basis or on an RE basis. One RB may include one or more REs. That the processed first bit sequence is mapped onto the physical resource may be understood as that an information symbol corresponding to the first bit sequence is mapped onto an RE, or may be understood as that an information symbol corresponding to the first bit sequence is mapped onto an RB.

Optionally, the one or more REs in the RB may be used to carry one or more pilot symbols. When the physical resource corresponding to the first bit sequence is determined, the one or more REs used to carry the one or more pilot symbols may be removed from the corresponding RB. In other words, remaining REs in the RB other than the one or more REs used to carry the one or more pilot symbols are used to carry information bit(s) corresponding to the first bit sequence.

It may be understood that processing performed before the first bit sequence is mapped onto the physical resource may include various different cases, and the foregoing is merely an example. For example, the processing may further include cascading, puncturing, and the like. A process and a sequence of the processing may vary with a requirement of the system.

It may be understood that the RB is an example of the physical resource, and the physical resource may be in another different form. Optionally, the first bit sequence may correspond to one or more RBs.

As described above, when resource allocation is being performed, the physical resource corresponding to the transport block is determined. In this case, the physical resource corresponding to the first bit sequence is also determined.

Based on information about the physical resource corresponding to the first bit sequence, the quantity of bits that can be carried by the physical resource may be known. For example, the quantity of bits that can be carried by the physical resource may be related to a modulation order, a quantity of RBs, and a quantity of REs included in one RB. For example, it is assumed that a quantity of RBs corresponding to the first bit sequence is $N_{PRB}$, a modulation order is $Q_m$, a quantity of REs included in one RB is $I_{RB}$, and a quantity of layers onto which each transport block is mapped is $N_L$. In this case, a possible manner of determining $N_1$ is that $N_1 \approx N_{PRB} \times I_{RB} \times Q_m \times N_L$.

Optionally, if the system includes a design of a limited buffer (Limited Buffer), a size of a limited cyclic buffer further needs to be considered when $N_1$ is determined. For example, it is assumed that a quantity of bits that is obtained through direct calculation based on the information about the related physical resource is Nk and a size of a limited buffer is NIR. In this case, a smaller value in NK and NIR may be selected as $N_1$, that is, $N_1$=min (Nk, NIR).

2. For the Parameter L

The value of L is equal to $(B+B_1)/R_{min,K_{max}}$. It may be understood that $R_{min,K_{max}}$ is a limited bit rate of the encoder. In an entire transmission process, a bit rate in a larger range can be implemented by performing a rate matching operation after encoding.

For example, it is assumed that $R_{min,K_{max}}$=1/3 and $B_1$=0. In this case, $B/R_{min,K_{max}}$ is 3×B. A specific value of $(B+B_1)/R_{min,K_{max}}$, namely, the value of L is used for determining C.

Specifically, the specific value of $(B+B_1)/R_{min,K_{max}}$ may be obtained by using a multiplier and an adder, or may be obtained by using only the adder, or may be obtained in another manner. This is not limited in this embodiment of this application.

3. For the Parameter B

Depending on different processing of the to-be-sent bit sequence, B may be determined in different manners. For example, it is assumed that the first bit sequence is a sequence obtained by adding a check bit to a transport block, a transport block length is $K_{TB}$, and a length of the added check bit is $L_{TB}$. In this case, $B=K_{TB}+L_{TB}$.

It should be noted that a value of $L_{TB}$ may be 0. In other words, an operation of adding the check bit to the transport block is not required. When $L_{TB}$ is equal to 0, $B=K_{TB}$.

4. For the Parameter $B_1$

Herein, $B_1$ is an adjustment value or a correction value, and a value of $B_1$ may be set based on a design requirement of the system. It may be understood that the adjustment value is not required. In other words, $B_1$ is equal to 0.

When $B_1$ is greater than 0, that is, when the adjustment value needs to be designed, a possible design is as follows: After the first bit sequence is segmented, the segmented bit sequences may be classified into A code block groups, and code block group check bit(s) may be added to each code block group. For example, the code block group check bit may be added after a last code block in each code block group.

In this embodiment of this application, a check bit added to the code block group may be referred to as the code block group check bit, and a check bit added to a code block is referred to as a code block check bit.

For example, it is assumed that C=12, A=4, and a bit quantity of code block group check bits added to each code block group is 24. To be specific, 12 segmented bit sequences are classified into four code block groups, and each code block group includes three segmented bit sequences. A sum of quantities of code block group check bits of four code block groups is 24×4=96.

It is assumed that bits in each bit sequence obtained after the code block segmentation and code block grouping are represented as $c_{r0}, c_{r1}, \ldots, c_{r(K_r-1)}$, where r is a number of each bit sequence, and $K_r$ is a length of a $r^{th}$ bit sequence. If the $r^{th}$ bit sequence is a last bit sequence in one code block group, bits following a bit $c_{r(K_r-L_{CB}-L_{CBG}-1)}$ are check bits including a code block check bit and a code block group check bit. The code block group check bit may be located before or after the code block check bit. Herein, $L_{CBG}$ is a length of the code block group check bit, and $L_{CB}$ is a length of the code block check bit. If the $r^{th}$ bit sequence is not a last bit sequence in the code block group, a bit following the bit $c_{r(K_r-L_{CB}-L_{CBG}-1)}$ is a code block check bit.

It may be understood that the foregoing manner of adding the code block group check bit may be not only applied to a system that uses a code block segmentation method in this embodiment of this application, but also applied to a system that uses another code block segmentation method. In other words, the foregoing manner of adding the code block group check bit is not coupled with the code block segmentation method in this embodiment of this application. Provided that the object of the code block segmentation is the code block group, the check bit may be added to the code block group in the manner in this embodiment of this application.

If a code block grouping operation is performed before the encoding and the code block group check bits are added to the code block groups, a sum of quantities of code block group check bits may be considered when C is being determined. The value of $B_1$ is equal to the sum of the quantities of code block group check bits of the A code block groups. Therefore, $B_1$ can be determined based on A and the quantity of code block group check bits of each code block group. When the quantity C of segmented bit sequences is being determined, the quantity of code block group check bits is considered in advance. In this way, the following problem can be avoided: A difference between lengths of the segmented bit sequences is relatively large and bit rates of different encoded code blocks are not uniform. Therefore, decoding performance is improved.

It should be noted that the code block group check bit may be not considered in the following three scenarios: An operation of adding the code block group check bit is not performed on the code block group; the grouping operation is not performed after the first bit sequence is segmented; or to simplify operation, $B_1$ is not considered even if the operation of adding the code block group check bit is performed on the code block group. In this case, when C is being determined, $B_1$ may not be considered, or it may be regarded that $B_1=0$. In this case, the value of L is equal to $B/R_{min,K_{max}}$.

It may be understood that the value of $B_1$ may also be related to one or more other parameters based on the design requirement of the system. This is not limited in this application.

5. For the Parameter C

Optionally, a possible manner of determining C may be as follows:

(1) When $L < N_1$, $C = \lceil N_1/N_{max} \rceil$, where $\lceil \; \rceil$ represents rounding up, and a value of $N_{max}$ is equal to a value of $K_{max}/R_{min,K_{max}}$. For example, if $B=9000$, $R_{min,K_{max}}=1/3$, $K_{max}=8000$, and $N_1=60000$, $L=27000$, $N_{max}=24000$, and $$C = \left\lceil \frac{60000}{24000} \right\rceil = 3.$$

Generally, when the bit rate is fixed, a long length of an encoded bit sequence indicates a great code length gain. In addition, if a length of a block encoded by the encoder is limited to $N_{max}$, when a length of a code block obtained after encoding and rate matching is greater than $N_{max}$, the encoding and the rate matching can only be implemented in a simple duplication manner, thereby resulting in an encoding gain loss and a loss of decoding performance of the entire transport block. Herein, C determined in the foregoing manner enables that a code block length of a segmented code block obtained after encoding and rate matching is as close to $N_{max}$ as possible, and a code length gain can be obtained as much as possible without losing a bit rate gain, thereby improving decoding performance.

Further, when an encoding bit rate supported by the encoder has a minimum value, C obtained according to $C=\lceil N_1/N_{max} \rceil$ may be relatively large. Therefore, a total quantity of segmented code blocks is relatively large, and an encoding input length of each code block is relatively short. This may affect decoding performance. To avoid the problem as much as possible, the foregoing formula may be further optimized. For example, $C=\lceil N_1'/N_{max} \rceil$, where $N_1'$ may be understood as a correction for $N_1$, $N_1'=\min(N_1, (B+B_1)/R_{min})$. To be specific, a smaller value in $(B+B_1)/R_{min}$ and $N_1$ is determined as $N_1'$, and $R_{min}$ represents a minimum bit rate used for encoding and may also be referred to as an available minimum bit rate. For example, $R_{min}$ may be 1/5. This is not limited in this embodiment of this application. For example, $N_{max}=2000$, and it is assumed that $N_1=16000$, $(B+B_1)=1000$, $R_{min,K_{max}}=1/3$, and $R_{min}=1/4$. In this case, $L=1000 \times 3=3000$. If that $C=8$ is obtained according to $C=\lceil N_1/N_{max} \rceil$, an input length of each code block is 125, a length obtained after encoding based on a minimum bit rate 1/4 is 500. Duplication needs to be performed to obtain 16000/8=2000 bits. However, if that $C=4$ is obtained according to $C=\lceil N_1'/N_{max} \rceil$, an input length of each code block is 500, a length obtained after encoding based on the minimum bit rate 1/4 is 2000 bits. Duplication is performed to obtain 4000 bits.

When the encoding bit rate supported by the encoder has the minimum value, in this case, if the segmentation is performed by allocating, to each segmented code block, a resource supporting a bit sequence with a length of $N_{max}$, because each bit sequence includes duplicated bits, an actual length of the encoded bit sequence is less than $N_{max}$, thereby resulting in a relatively large quantity of segmented code blocks and a relatively small quantity of bits included in each code block. In the foregoing improved method, an encoded length of each segmented code block is as close to $N_{max}$ as possible, the quantity of segmented code blocks is relatively small, and the quantity of bits included in each code block is relatively large, thereby improving decoding performance.

Optionally, another possible manner of determining C may be as follows:

(2) When $L < N_1$, $C_{tmp}=\lceil N_1/N_{max} \rceil$, where $\lceil \; \rceil$ represents rounding up, and a value of $N_{max}$ is equal to a value of $K_{max}/R_{min,K_{max}}$.

Herein, a threshold $N_{threshold}$ is defined, and $N_{threshold}$ represents a minimum length of a segmented bit sequence obtained after encoding and rate matching. When $\lceil N_1/C_{tmp} \rceil < N_{threshold}$, it indicates that if the first bit sequence is segmented by using $C_{tmp}$, a length of a bit sequence obtained after encoding and rate matching is excessively short, and a value of $C_{tmp}$ may be reduced. In this case, $C_{tmp}$ may be adjusted by using an offset $\Delta$, $\Delta$ needs to meet that $\lceil (B+B_1)/(C_{tmp}-\Delta) \rceil \leq K_{max}$, and $\Delta$ is a positive integer. For example, $\Delta$ may be 1. A specific value of $\Delta$ may be determined according to an actual situation. This is not limited in this embodiment of this application. Optionally, if there is no $\Delta$ that meets the condition, $\Delta$ may be 0.

When $\lceil N_1/C_{tmp} \rceil \geq N_{threshold}$, $C=C_{tmp}$.

Herein, the manner of determining C may be understood as a manner further optimized based on the manner (1) of determining C. When a block length of an encoded segmented bit sequence is less than $N_{threshold}$, it indicates that a gain loss of an encoded block length caused due to the code block segmentation operation is relatively large. After $C_{tmp}$ is corrected by using the offset $\Delta$, the gain loss of the encoded block length can be reduced, and decoding performance can be improved.

For example, it is assumed that the check bits of the code block group are not considered, B=5000, $R_{min,K_{max}}=1/3$, = 8000, and $N_1$=30000. In this case, L=15000, L<$N_1$, and $N_{max}$=24000. Then, $$C_{imp} = \left\lceil \frac{30000}{24000} \right\rceil = 2.$$

It is further assumed that $N_{threshold}$=18000. In this case, $$\left\lceil \frac{30000}{2} \right\rceil = 15000 < 18000,$$

and $C_{tmp}$ may be corrected. It is set that the offset Δ=1, and ⌈5000/(2−1)⌉=5000<8000. In this case, C=2−1=1.

Further, a manner of obtaining $C_{tmp}$ may be optimized by using a scheme similar to the optimization scheme mentioned in the manner (1). For example, when L<$N_1$, $C_{tmp}$=⌈$N_1'/N_{max}$⌉ and $N_1'$=min ($N_1$, (B+$B_1$)/$R_{min}$); and when ⌈$N_1'/C_{tmp}$⌉<$N_{threshold}$, C=$C_{tmp}$−Δ, where $N_{threshold}$ is a preset threshold, Δ is an offset, Δ is a positive integer, and a value of Δ meets that ⌈(B+$B_1$)/($C_{tmp}$−Δ)⌉≤$K_{max}$.

Optionally, another possible manner of determining C may be as follows:

(3) When L≥$N_1$, C=⌈(B+$B_1$)/($K_{max}$−$L_{CB}$)⌉, where ⌈ ⌉ represents rounding up, and $L_{CB}$ is a bit quantity of check bits included in the segmented bit sequence.

The check bit herein may be the CRC bit, or may be another check bit. This is not limited in this embodiment of this application.

When the segmented bit sequence does not include the check bit, $L_{CB}$=0, and C=⌈(B+$B_1$)/$K_{max}$⌉.

Alternatively, when the segmented bit sequence includes the check bit, but the check bit of the code block group is not considered, $B_1$=0, and C=⌈B/($K_{max}$−$L_{CB}$)⌉.

Alternatively, when the segmented bit sequence does not include the check bit, and the check bit of the code block group is not considered, both $L_{CB}$ and $B_1$ are equal to 0, and C=⌈B/$K_{max}$⌉.

For example, when both $L_{CB}$ and $B_1$ are equal to 0, it is assumed that B=15000, $R_{min,K_{max}}$=1/3, $K_{max}$=8000, and $N_1$=30000. In this case, L=45000, L>$N_1$, $$C = \left\lceil \frac{15000}{8000} \right\rceil = 2,$$

and the length of the segmented bit sequence is 7500.

When L≥$N_1$, it indicates that a quantity of encoded bits may not be limited. Therefore, when the length of the segmented bit sequence is less than $K_{max}$, the length of each segmented bit sequence may be as long as possible, thereby obtaining a relatively ideal code length gain and improving decoding performance.

It may be understood that, when C is being determined, $N_1$ may be directly compared with (B+$B_1$)/$R_{min,K_{max}}$, or $N_1$ may be compared with B/$R_{min,K_{max}}$. This is not limited in this embodiment of this application. The foregoing $B_1$ is the adjustment value (or the correction value), and the value of $B_1$ may be defined based on a system design. For example, when $B_1$ is greater than 0, the value of $B_1$ is equal to data length of the code block group corresponding to the C segmented bit sequences. In this design, because the quantity of code block group check bits is considered in advance when the quantity C of segmented bit sequences is being determined, lengths of bit sequences before encoding may be close to each other, and performance can be improved.

Alternatively, it may be designed that the value of $B_1$ may be designed is related to one or more other system parameters. This is not limited.

In the foregoing scheme for determining C, the adjustment value $B_1$ may not be required. In other words, $B_1$ is equal to 0. For ease of description, $B_1$ is introduced in both the description and the formulas. It may be understood that, when the adjustment value $B_1$ is not required, that is, when $B_1$ is equal to 0, the foregoing formulas may be transformed accordingly to exclude the parameter $B_1$.

Figure 6:
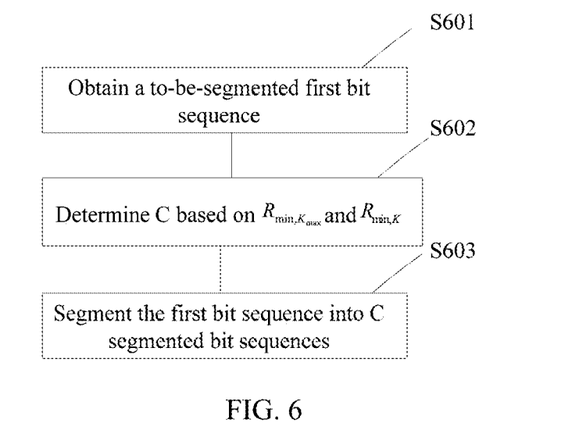
FIG. 6 is a schematic flowchart of a communication method according to an embodiment of this application.

Another embodiment of this application further provides a communication method. The communication method is implemented on a transmit side by a communications apparatus. As shown in FIG. 6, the method includes the following steps.

S601. Obtain a to-be-segmented first bit sequence, where a quantity of bits in the first bit sequence is B, and a quantity of bits that can be carried by a physical resource corresponding to the first bit sequence is $N_1$.

For specific implementation and meaning of this step, refer to related descriptions of the foregoing embodiment. Details are not described herein again.

S602. Determine, based on a first bit rate R, $R_{min,K_{max}}$, and $R_{min,K}$, a quantity C of bit sequences obtained by segmenting the first bit sequence, where a value of R is equal to (B+$B_1$)/$N_1$.

Specifically, for meanings and values of $R_{min,K_{max}}$ and $B_1$, refer to the related descriptions of the foregoing embodiment.

Specifically, $R_{min,K}$ indicates that when a length of an encoded block is not limited, a minimum bit rate supported by an encoder may be a predefined value, for example, 1/5.

Determining C based on R, $R_{min,K_{max}}$ and $R_{min,K}$ specifically includes:

, when R≥$R_{min,K_{max}}$, determining that C=⌈(B+$B_1$)/($K_{max}$−$L_{CB}$)⌉, where for meanings and values of $L_{CB}$ and $K_{max}$, reference may also be made to the related descriptions of the foregoing embodiment. Details are not described herein again.

Alternatively, when R<$R_{min,K_{max}}$, it is set that K=⌊$N_{max}$×max(R,$R_{min,K}$)⌋. C'=⌈(B+$B_1$)/(K−$L_{CB}$)⌉. When ⌈B/C'⌉<$K_{threshold}$, it indicates that if C'' is used as the quantity of segmented bit sequences, a relatively large gain loss of an encoded block length may be caused. In this case, C' may be reduced. In other words, C=C−Δ, where Δ is an offset, Δ is a positive integer, and Δ is set, so that $K_{threshold1}$≤⌈(B+$B_1$)/C⌉≤$K_{threshold2}$. Herein, $K_{threshold1}$ and $K_{threshold2}$ are preset thresholds, and $$\frac{K}{2} < K_{threshold1} < K < K_{threshold2} < K_{max}.$$

For example, Δ may be 1. If there is no Δ that meets the condition to meet that $K_{threshold1}$≤⌈(B+$B_1$)/C⌉≤$K_{threshold2}$, C=C'.

For example, B=5000, $B_1$=0, $R_{min,K_{max}}$=1/3, $R_{min,K}$=1/5, $K_{max}$=8000, $N_1$=30000, and $L_{CB}$=0. In this case, $N_{max}$=24000, $$R = \frac{5000}{30000} = \frac{1}{6} < \frac{1}{3},$$

$$K = \left\lfloor 24000 \times \max\left(\frac{1}{6}, \frac{1}{5}\right)\right\rfloor = 4800,$$

and C'=⌈B/(K−$L_{CB}$)⌉=⌈5000/4800⌉=2. It is set that $K_{threshold1}$=3600, $K_{threshold2}$=6000, and the offset Δ=1. Herein, ⌈B/C⌉=⌈5000/(2−1)⌉=5000, 3600<5000<6000. In this case, C=2−1=1.

S603. Segment the first bit sequence into C segmented bit sequences.

For a manner of segmenting the first bit sequence based on C, refer to related descriptions of the foregoing embodiment.

After code block segmentation is performed, when a length of each code block before encoding is less than $K_{threshold}$, it indicates that, in this case, a gain loss of an encoded block length due to the code block segmentation is very large. After the total quantity C of segmented blocks is corrected by using the offset Δ, and after the total quantity of segmented blocks is reduced, the gain loss of the encoded block length can be reduced, and decoding performance can be improved. The offset Δ needs to meet that $$K_{threshold1} \leq \lceil B/C \rceil \leq K_{threshold2} \text{ and}$$

$$\frac{K}{2} < K_{threshold1} < K < K_{threshold2} < K_{max},$$

so as to avoid the following case: A corrected length of segmented block before encoding is greater than a maximum code block length $K_{max}$ supported by the encoder, or transport block decoding performance decreases due to excessively large loss of a block length or a bit rate after encoding.

It should be noted that the foregoing process is an example used to describe the implementation of code block segmentation on the transmit side. Correspondingly, decoding and concatenation may be performed on a receive side by using a corresponding method. For example, a same method as that used on the transmit side may be used to determine the quantity C of segmented bit sequences on the transmit side, so that the receive side knows that C code blocks need to be decoded and concatenated. In other words, in a communication method on the receive side, after C is determined, a size of a bit sequence before encoding and a size of a bit sequence after encoding may be determined based on C; decoding is performed; and after decoding is completed, concatenation is performed to obtain a decoded transport block. The foregoing decoding and concatenation may be implemented on the receive side by using a communications apparatus.

Figure 7:
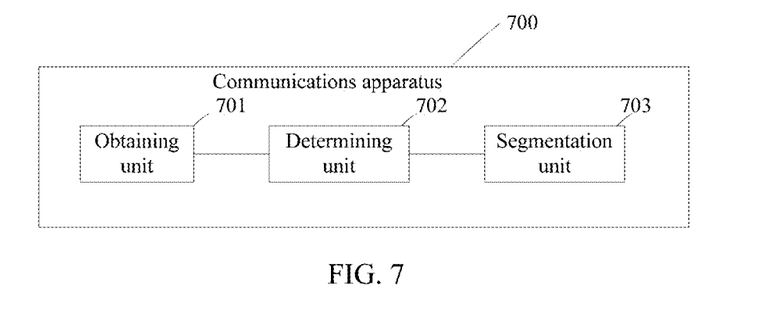
FIG. 7 is a schematic structural diagram of a communications apparatus according to an embodiment of this application.

An embodiment of this application further provides a communications apparatus 700. The communications apparatus 700 is configured to implement the foregoing communication method implemented on a transmit side. As shown in FIG. 7, the communications apparatus may include:

an obtaining unit 701, configured to obtain a to-be-segmented first bit sequence, where a quantity of bits in the first bit sequence is B, and a quantity of bits that can be carried by a physical resource corresponding to the first bit sequence is $N_1$;

a determining unit 702, configured to determine, based on $N_1$ and a parameter L, a quantity C of bit sequences obtained by segmenting the first bit sequence, where a value of L is equal to (B+$B_1$)/$R_{min,K_{max}}$, $R_{min,K_{max}}$ is a minimum bit rate corresponding to an available maximum code block length $K_{max}$, and $B_1$ is an integer greater than or equal to 0; and a segmentation unit 703, configured to segment the first bit sequence into C segmented bit sequences.

It should be noted that the obtaining unit 701, the determining unit 702, and the segmentation unit 703 may be independent logical function modules, or may be implemented by using an integrated function unit. This is not limited in this embodiment of this application. Further, for specific functions and implementations of the foregoing units, refer to related descriptions of the method embodiments.

Figure 8:
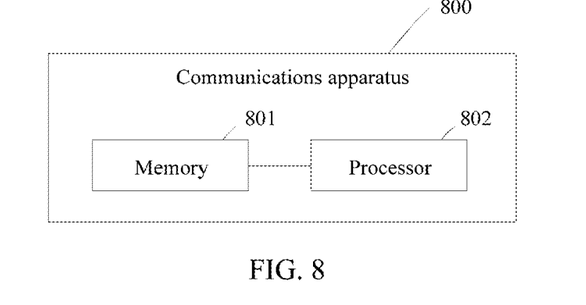
FIG. 8 is a schematic structural diagram of a communications apparatus according to another embodiment of this application.

Another embodiment of this application further provides a communications apparatus 800. The communications apparatus 800 is configured to implement the foregoing communication method implemented on a transmit side. As shown in FIG. 8, the communications apparatus may include a memory 801 and a processor 802. In different applications, the memory 801 and the processor 802 may have different functions.

For example, the memory 801 may be configured to store a to-be-segmented first bit sequence, where a quantity of bits in the first bit sequence is B, and a quantity of bits that can be carried by a physical resource corresponding to the first bit sequence is $N_1$. The processor 802 may be configured to: determine, based on $N_1$ and a parameter L, a quantity C of bit sequences obtained by segmenting the first bit sequence, where a value of L is equal to (B+$B_1$)/$R_{min,K_{max}}$, $R_{min,K_{max}}$ is a minimum bit rate corresponding to an available maximum code block length $K_{max}$, and $B_1$ is an integer greater than or equal to 0; and segment the first bit sequence into C segmented bit sequences.

It may be understood that, when being input, the first bit sequence that needs to be segmented may be stored in the memory 801. The memory 801 is a unit for implementing a storage function, for example, may be a register, a random access memory (RAM), or a cache. This is not limited in this embodiment of this application.

For another example, the memory 801 may be configured to store an instruction for implementing the communication method described in the foregoing embodiments, and the processor 802 may be configured to execute the foregoing instruction to implement the communication method described in the foregoing embodiments. For example, the processor 802 may be configured to: obtain the to-be-segmented first bit sequence, where the quantity of bits in the first bit sequence is B, and the quantity of bits that can be carried by the physical resource corresponding to the first bit sequence is $N_1$; determine, based on $N_1$ and the parameter L, the quantity C of bit sequences obtained by segmenting the first bit sequence, where the value of L is equal to (B+$B_1$)/$R_{min,K_{max}}$, $R_{min,K_{max}}$ is the minimum bit rate corresponding to the available maximum code block length $K_{max}$, and $B_1$ is an integer greater than or equal to 0; and segment the first bit sequence into the C segmented bit sequences.

It may be understood that, in the foregoing cases, the memory 801 and the processor 802 may exist independently, or may be integrated on one chip. Forms of the memory 801 and the processor 802 are not limited in this embodiment of this application.

Further, for a specific function and implementation of the processor 802 in this embodiment of this application, refer to related descriptions in the method embodiments. Details are not described herein again. It may be understood that the processor 802 herein may also correspondingly implement corresponding functions of the determining unit 702 and the segmentation unit 703 in the foregoing embodiment.

In the embodiments of this application, the communications apparatuses provided in the embodiments described in FIG. 7 and FIG. 8 in this application determine the quantity of segmented code blocks with reference to $N_1$ and L, so as to avoid an encoding gain loss as much as possible, thereby providing a proper code block segmentation scheme.

It should be noted that the communications apparatuses provided in the foregoing embodiments described in FIG. 7 and FIG. 8 may further include another unit in addition to the function units shown in the accompanying drawings, for example, may further include a unit for implementing a transceiver function. This is not limited in this embodiment of this application.

In the several embodiments provided in this application, it should be understood that the disclosed apparatus and method may be implemented in other manners. For example, the described apparatus embodiments are merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, function units in the embodiments of this application may be integrated into one processing unit, or each of the units may exist alone physically, or two or more units are integrated into one unit. The integrated unit may be implemented in a form of hardware, or may be implemented in a form of hardware in addition to a software function unit.

The foregoing software function part may be stored in a storage unit. The storage unit includes several instructions used to enable a computer device (which may be a personal computer, a server, a network device, or the like) or a processor to perform some of the steps of the methods described in the embodiments of this application. The storage unit includes one or more memories, for example, a read-only memory (ROM), a random access memory (RAM), and an electrically erasable programmable read-only memory (EEPROM). The storage unit may independently exist, or may be integrated into the processor.

It may be clearly understood by a person skilled in the art that, for the purpose of convenient and brief description, division of the foregoing function modules is used as an example for illustration. In actual application, the foregoing functions can be allocated to different function modules and implemented based on a requirement. In other words, an inner structure of an apparatus is divided into different function modules to implement all or some of the functions described above. For a detailed working process of the foregoing apparatus, refer to a corresponding process in the foregoing method embodiments. Details are not described herein again.

A person of ordinary skill in the art may understand that first, second, and various reference numerals in this specification are for distinguishing only for ease of description, and are not used to limit a scope of the embodiments of this application.

A person of ordinary skill in the art may understand that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, microwave, or the like) manner. The computer-readable storage medium may be any usable medium accessible by a computer, or a data storage device integrating one or more usable media, such as a server or a data center. The usable medium may be a magnetic medium (for example, a floppy disk, a hard disk, or a magnetic tape), an optical medium (for example, a DVD), a semiconductor medium (for example, a solid state drive Solid State Disk (SSD)), or the like.

Finally, it should be noted that the foregoing embodiments are merely intended for describing the technical solutions of this application instead of limiting this application. Although this application is described in detail with reference to the foregoing embodiments, a person of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:

1. A communication method, comprising:

obtaining, by a communication apparatus, a to-be-segmented first bit sequence, wherein a quantity of bits in the first bit sequence is B, and a quantity of bits that can be carried by a physical resource corresponding to the first bit sequence is $N_1$;

determining, by the communication apparatus, based on $N_1$ and a parameter L, a quantity C of bit sequences obtained by segmenting the first bit sequence, wherein a value of L is equal to $(B+B_1)/R_{min,K_{max}}$, $R_{min,K_{max}}$ is a minimum bit rate corresponding to an available maximum code block length $K_{max}$, and $B_1$ is an integer greater than or equal to 0;

segmenting, by the communication apparatus, the first bit sequence into C segmented bit sequences; and transmitting, by the communication apparatus, the C segmented bit sequences to a receiving device.

2. The method according to claim 1, wherein the determining C based on $N_1$ and L comprises:
when $L<N_1$, $C=\lceil N_1/N_{max}\rceil$, wherein $\lceil\ \rceil$ resents rounding up, and a value of $N_{max}$ is equal to a value of $K_{max}/R_{min,k_{max}}$.

3. The method according to claim 1, wherein the determining C based on $N_1$ and L comprises:
when $L<N_1$, $C_{tmp}=\lceil N_1/N_{max}\rceil$, wherein $\lceil\ \rceil$ represents rounding up, and a value of $N_{max}$ is equal to a value of $K_{max}/R_{min,k_{max}}$; and
when $\lceil N_1/C_{tmp}\rceil<N_{threshold}$, $C=C_{tmp}-\Delta$, wherein $N_{threshold}$ is a preset threshold, $\Delta$ is an offset, $\Delta$ is a positive integer, and a value of $\Delta$ meets that $\lceil(B+B_1)/(C_{tmp}-\Delta)\rceil\leq K_{max}$.

4. The method according to claim 1, wherein the determining C based on $N_1$ and L comprises:
when $L<N_1$, $C=\lceil N_1'/N_{max}\rceil$, wherein $\lceil\ \rceil$ represents rounding up, a value of $N_{max}$ is equal to a value of $K_{max}/R_{min,K_{max}}$, $N_1'=\min(N_1, (B=B_1)/R_{min})$, and $R_{min}$ is a minimum bit rate used for encoding.

5. The method according to claim 1, wherein the determining C based on $N_1$ and L comprises:
when $L<N_1$, $C_{tmp}=\lceil N_1'/N_{max}\rceil$, wherein $\lceil\ \rceil$ represents rounding up, a value of $N_{max}$ is equal to a value of $K_{max}/R_{min,K_{max}}$, $N_1'=\min(N_1, (B=B_1)/R_{min})$, and $R_{min}$ is a minimum bit rate used for encoding; and
when $\lceil N_1'/C_{tmp}\rceil<N_{threshold}$, $C=C_{tmp}-\Delta$, wherein $N_{threshold}$ is a preset threshold, $\Delta$ is an offset, $\Delta$ is a positive integer, and a value of $\Delta$ meets that $\lceil(B+B_1)/(C_{tmp}-\Delta)\rceil\leq K_{max}$.

6. The method according to claim 1, wherein the determining C based on $N_1$ and L comprises:
when $L\geq N_1$, $C=\lceil(B+B_1)/(K_{max}-L_{CB})\rceil$, wherein $\lceil\ \rceil$ represents rounding up, and $L_{CB}$ is a quantity of check bits comprised in a segmented bit sequence.

7. The method according to claim 1, wherein $B=K_{TB}+L_{TB}$, $K_{TB}$ is a transport block length, $L_{TB}$ is a quantity of check bits in a transport block, and $L_{TB}$ is an integer greater than or equal to 0.

8. The method according to claim 1, wherein $B_1=0$, and the value of L is equal to $B/R_{min,K_{max}}$.

9. The method according to claim 1, wherein a value of $B_1$ is equal to a sum of quantities of code block group check bits in A code block groups, and A is a quantity of groups of the C segmented bit sequences.

10. The method according to claim 9, wherein the method further comprises: adding a code block group check bit after a last code block in each of the A code block groups.

11. A communications apparatus, comprising:
a memory, configured to store a to-be-segmented first bit sequence, wherein a quantity of bits in the first bit sequence is B, and a quantity of bits that can be carried by a physical resource corresponding to the first bit sequence is $N_1$; and
a processor communicatively coupled to the memory and configured to:
determine, based on $N_1$ and a parameter L, a quantity C of bit sequences obtained by segmenting the first bit sequence, wherein a value of L is equal to $(B+B_1)/R_{min,K_{max}}$, $R_{min,K_{max}}$ is a minimum bit rate corresponding to an available maximum code block length $K_{max}$, and $B_1$ is an integer greater than or equal to 0;
segment the first bit sequence into C segmented bit sequences; and
a transmitter configured to transmit the C segmented bit sequences to a receiving device.

12. The apparatus according to claim 11, wherein the processor is configured to:
when $L<N_1$, determine that $C=\lceil N_1/N_{max}\rceil$, wherein $\lceil\ \rceil$ represents rounding up, and a value of $N_{max}$ is equal to a value of $K_{max}/R_{min,K_{max}}$.

13. The apparatus according to claim 11, wherein the processor is configured to:
when $L<N_1$, determine that $C_{tmp}=\lceil N_1/N_{max}\rceil$, wherein $\lceil\ \rceil$ represents rounding up, and a value of $N_{max}$ is equal to a value of $K_{max}/R_{min,K_{max}}$; and
when $\lceil N_1/C_{tmp}\rceil<N_{threshold}$, determine that $C=C_{tmp}-\Delta$, wherein $N_{threshold}$ is a preset threshold, $\Delta$ is an offset, $\Delta$ is a positive integer, and a value of $\Delta$ meets that $\lceil(B+B_1)/(C_{tmp}-\Delta)\rceil\leq K_{max}$.

14. The apparatus according to claim 11, wherein the processor is configured to:
when $L<N_1$, determine that $C=\lceil N_1'/N_{max}\rceil$, wherein represents rounding up, a value of $N_{max}$ is equal to a value of $K_{max}/R_{min,K_{max}}$, $N_1'=\min(N_1, (B=B_1)/R_{min})$, and $R_{min}$ is a minimum bit rate used for encoding.

15. The apparatus according to claim 11, wherein the processor is configured to:
when $L<N_1$, determine that $C_{tmp}=\lceil N_1'/N_{max}\rceil$, wherein $\lceil\ \rceil$ represents rounding up, a value of $N_{max}$ is equal to a value of $K_{max}/R_{min,K_{max}}$, $N_1'=\min(N_1, (B+B_1)/R_{min})$, and $R_{min}$ is a minimum bit rate used for encoding; and
when $\lceil N_1'/C_{tmp}\rceil<N_{threshold}$, determine that $C=C_{tmp}-\Delta$, wherein $N_{threshold}$ is a preset threshold, $\Delta$ is an offset, $\Delta$ is a positive integer, and a value of $\Delta$ meets that $\lceil(B+B_1)/(C_{tmp}-\Delta)\rceil\leq K_{max}$.

16. The apparatus according to claim 11, wherein the processor is configured to:
when $L\geq N_1$, determine that $C=\lceil(B+B_1)/(K_{max}-L_{CB})\rceil$, wherein $\lceil\ \rceil$ represents rounding up, and $L_{CB}$ is a quantity of check bits comprised in a segmented bit sequence.

17. The apparatus according to claim 11, wherein $B=K_{TB}+L_{TB}$, $K_{TB}$ is a transport block length, $L_{TB}$ is a quantity of check bits in a transport block, and $L_{TB}$ is an integer greater than or equal to 0.

18. The apparatus according to claim 11, wherein $B_1=0$, and the value of L is equal to $B/R_{min,K_{max}}$.

19. The apparatus according to claim 11, wherein a value of $B_1$ is equal to a sum of quantities of code block group check bits in A code block groups, and A is a quantity of groups of the C segmented bit sequences.

20. The apparatus according to claim 19, wherein a code block group check bit is added after a last code block in each of the A code block groups.

* * * * *

UNITED STATES PATENT AND TRADEMARK OFFICE
CERTIFICATE OF CORRECTION

PATENT NO. : 11,139,917 B2
APPLICATION NO. : 16/580961
DATED : October 5, 2021
INVENTOR(S) : Ma et al.

Page 1 of 1

It is certified that error appears in the above-identified patent and that said Letters Patent is hereby corrected as shown below:

On the Title Page

Item (56) Page 2, Other Publications, Citation 4: "Valbonne, France (Dec. 2012)." should read -- Valbonne, France (Dec. 2016). --.

Signed and Sealed this
Twenty-eighth Day of June, 2022

Katherine Kelly Vidal
*Director of the United States Patent and Trademark Office*